(12) United States Patent
Adamski et al.

(10) Patent No.: US 8,130,042 B2
(45) Date of Patent: Mar. 6, 2012

(54) METHODS AND DEVICES FOR LEAKAGE CURRENT REDUCTION

(75) Inventors: Jaroslaw Adamski, Streamwood, IL (US); Daniel Losser, Grayslake, IL (US); Vikas Sharma, Elgin, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 84 days.

(21) Appl. No.: 12/799,910

(22) Filed: May 3, 2010

(65) Prior Publication Data
US 2010/0308919 A1 Dec. 9, 2010

Related U.S. Application Data

(63) Continuation-in-part of application No. 12/455,671, filed on Jun. 3, 2009, now Pat. No. 7,872,533.

(51) Int. Cl.
H03F 3/04 (2006.01)
(52) U.S. Cl. ........................ 330/297; 330/296
(58) Field of Classification Search ................ 330/297, 330/296, 285
See application file for complete search history.

(56) References Cited

U.S. PATENT DOCUMENTS

| | | | |
|---|---|---|---|
| 4,244,016 A | 1/1981 | Mitchell | |
| 6,630,867 B2 * | 10/2003 | Canyon et al. | 330/297 |
| 6,646,511 B2 * | 11/2003 | Canyon et al. | 330/297 |
| 7,173,491 B2 * | 2/2007 | Bocock et al. | 330/285 |
| 7,248,120 B2 | 7/2007 | Burgener et al. | |
| 7,449,954 B2 | 11/2008 | Bocock et al. | |
| 7,489,196 B2 * | 2/2009 | Vaiana et al. | 330/285 |
| 7,551,032 B2 * | 6/2009 | Dupuis et al. | 330/285 |
| 7,593,702 B1 | 9/2009 | Lie et al. | |
| 7,639,068 B2 * | 12/2009 | Mizuno et al. | 327/541 |
| 7,679,433 B1 * | 3/2010 | Li | 330/10 |
| 7,872,533 B2 | 1/2011 | Adamski | |
| 7,961,052 B2 | 6/2011 | Bacon et al. | |

OTHER PUBLICATIONS

Nguyen, Hieu P., Office Action received from the USPTO for related U.S. Appl. No. 12/657,727 dated Jun. 10, 2011, 12 pgs.
Choe, Henry, Office Action received from the USPTO for related U.S. Appl. No. 12/657,728, dated Jun. 15, 2011, 4 pgs.
Adamski, Jarolsaw, et al., Response filed in the USPTO dated Aug. 3, 2011 for related U.S. Appl. No. 13/008,711, 10 pgs.
Tran, Pablo N., Notice of Allowance received from the USPTO dated May 19, 2011 for related U.S. Appl. No. 11/501,125, 11 pgs.
Choe, Henry, Office Action received from USPTO for related U.S. Appl. No. 13/008,711, dated Apr. 4, 2011, 7 pgs.
Choe, Henry, Notice of Allowance received from USPTO for related U.S. Appl. No. 12/455,671, dated Sep. 7, 2010, 12 pages.
Adamski, et al., Issue Fee Transmittal and Comments on Examiner's Statement of Reasons for Allowance filed in the USPTO for related U.S. Appl. No. 12/455,671 dated Dec. 3, 2010, 3 pages.
Nguyen, Hieu, Notice of Allowance received from the USPTO dated Sep. 20, 2011 for related U.S. Appl. No. 12/590,839, 13 pgs.
Nguyen, Hieu, Notice of Allowance received from the USPTO dated Sep. 29, 2011 for related U.S. Appl. No. 12/657,727, 14 pgs.
Tran, Pablo N., Notice of Allowance received from the USPTO dated Oct. 6, 2011 for related U.S. Appl. No. 11/501,125, 11 pgs.

* cited by examiner

*Primary Examiner* — Henry Choe
(74) *Attorney, Agent, or Firm* — Jacquez & Associates; Martin J. Jaquez, Esq.; Alessandro Steinfl, Esq.

(57) ABSTRACT

Methods and devices for leakage current reduction are described. A regulator transistor is connected to a switch to bias the transistor with a first voltage during an ON state and a second voltage during the OFF state of the transistor. The switchable bias allows leakage current decrease and "on" resistance increase of the transistor.

38 Claims, 7 Drawing Sheets

METHODS AND DEVICES FOR LEAKAGE CURRENT REDUCTION

CROSS REFERENCE TO RELATED APPLICATIONS

The present application is a continuation-in-part of U.S. patent application Ser. No. 12/455,671 filed on Jun. 3, 2009 now U.S. Pat. No. 7,872,533 for "Leakage Current Reduction in a Power Regulator", incorporated herein by reference in its entirety.

BACKGROUND

1. Field

The present teachings relate to leakage current reduction. More particularly, the present teachings relates to methods and devices for leakage current reduction.

2. Description of Related Art

Mobile communication devices such as mobile telephones are generally powered by batteries. Therefore, it is desirable to improve the time before the battery charge is depleted. One method of improving battery life is to reduce the unintended current leakage from power supply to electrical ground or other reference voltage in the radio. By reducing this wasted current, the useful battery time is increased. Integrated circuit power amplifiers often have a regulator function that adjusts the output power of the amplifier. In order to further conserve power, these power amplifiers are turned off when the radio is not transmitting or operating in a transmission mode of operation.

When a power amplifier is operated in an OFF state, for example, the regulator shuts off the power to the amplifier and it is desirable to shut off the current flow through the regulator to as close to zero current as possible. Conversely, when the power amplifier is operated in an ON state, it is desirable for the regulator to have as little loss or voltage drop as possible to maximize power efficiency of the system.

An optimal regulator will therefore have very low leakage when OFF and very low loss when ON. One way to achieve low loss in the ON state is to use MOS transistors having low threshold voltage. When transistors having a low threshold voltage are used, the "on" resistance of those transistors is decreased when they are operated in the ON state as compared to transistors having a higher threshold voltage.

However, when MOS transistors having a low threshold voltage are used in a regulator, and the MOST transistors are operated in an OFF state, they may have a higher leakage current from source to drain because they are still in a sub-threshold operation when the gate-to-source voltage (Vgs) is equal to zero. Transistors having a higher threshold voltage generally have a lower leakage in the OFF state as compared to transistors having a lower threshold voltage.

As a mitigation effort, to reduce leakage from source-to-drain in the regulator transistors, an increase in the drawn channel length may be attempted. However, increasing the channel length of the regulator transistors has only a weak effect on the leakage current and has a significant reduction of efficiency due to increased "on" resistance. The need for a low-leakage, high-efficiency regulator circuit is clear.

Figure 1:
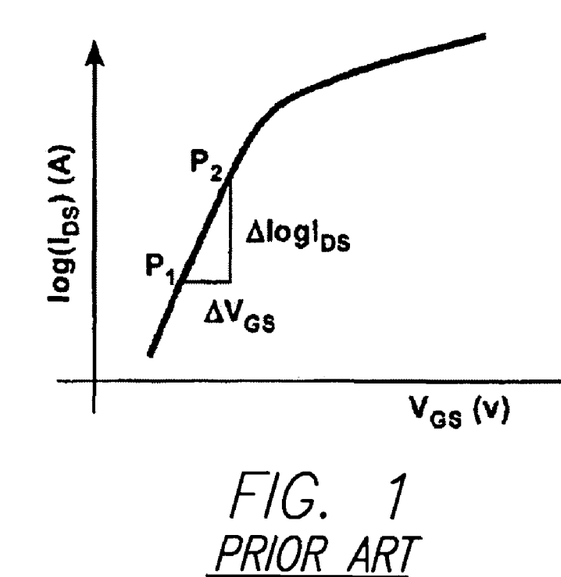
FIG. 1 is a diagram showing log(Ids) as a function of Vgs, in order to define transistor sub-threshold swing.

FIG. 1 shows the gate to source voltage Vgs as a function of log(Ids) for a MOS transistor. In sub-threshold operation, the dependency of Vgs on log(Ids) is linear. Two different points, P1 and P2, are taken on the sub-threshold portion of the curve, to define a $\Delta$Vgs and a $\Delta$ log Ids. A sub-threshold swing S can be defined as the reciprocal of the slope $\Delta$ log Ids/$\Delta$Vgs, i.e. S=$\Delta$Vgs/$\Delta$ log Ids. S is usually measured in millivolts per decade of $\Delta$ log Ids, i.e. mV/decade. For example, a sub-threshold swing S of 100 mV/decade means that a change in Vgs of 100 mV will result in a change in Ids of one decade (10×).

Figure 2:
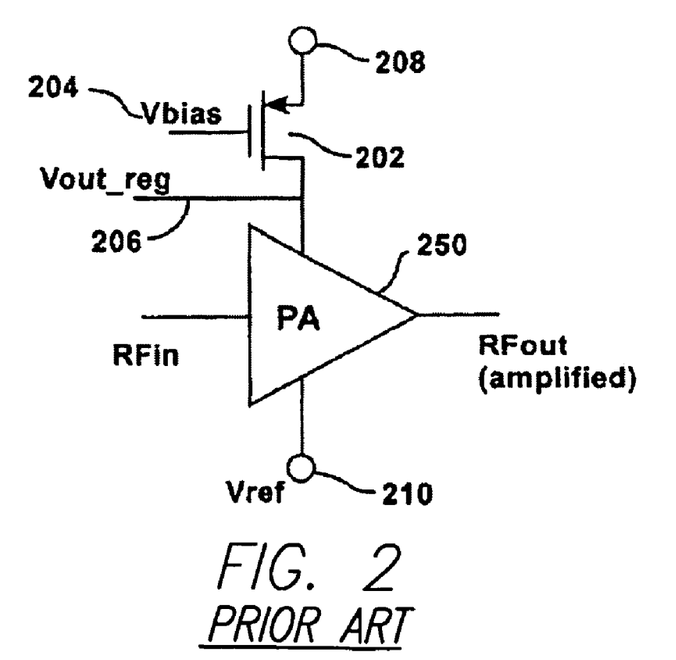
FIG. 2 shows a prior art arrangement of a power amplifier having a voltage regulator.

FIG. 2 shows a prior art arrangement of a power amplifier with voltage regulator. The voltage regulator of FIG. 2 comprises a p-channel MOS (202) located on top of a power amplifier PA (250). Regulator transistor (202) regulates the voltage output Vout_reg (206) of the power amplifier (250). Regulator transistor (202) can be in an ON condition—power supply Vdd (208) connected with the power amplifier (250)—or an OFF condition—power supply Vdd (208) disconnected from the power amplifier (250). The voltage signal Vbias (204) biases the regulator transistor (202) into the ON condition or the OFF condition.

In particular, when Vbias (204) increases towards the power supply Vdd (208), regulator transistor (202) starts to turn off, increasing its "on" resistance. As the "on" resistance of regulator transistor (202) increases, its source to drain voltage Vds increases. This causes a decrease in the regulated voltage output Vout_reg (206). The decrease in Vout_reg (206) reduces the amplification of the power amplifier (250). Conversely, when Vbias (204) decreases towards Vref (210), the regulator transistor (202) turns on, reducing its "on" resistance, thereby decreasing its Vds and increasing Vout_reg (206). This results in higher amplification of the power amplifier (250).

When the regulator transistor (202) is biased into the OFF condition, the Vgs of regulator transistor (202) is typically 0V, because the gate input voltage Vbias (204) is set to the power supply Vdd. If the p-channel regulator transistor (202) has a threshold voltage of 0.4V and a sub-threshold swing of 100 mV/decade, then the transistor (202) is passing a subthreshold current Ids at a current value of 4 decades below threshold.

Regulator transistors are typically very wide (in terms of the distance perpendicular to the current flow direction in the transistor), in order to minimize their resistance in the ON state. As an example, it can be assumed that the regulator transistor (202) has a total width of 100 mm and passes current at a rate of 20 mA per millimeter of width at threshold. Then the total current in the OFF condition is 100 mm×20 mA/mm width×1E–4=200 µA. A leakage current of 200 µA in the OFF condition is a significant battery drain and would be too high for practical use.

SUMMARY

According to a first aspect of the present teachings, an arrangement for reducing leakage current in a regulator transistor is provided, comprising: a first regulator transistor biased by an input voltage; a second regulator transistor connected with the first regulator transistor and biased by a first voltage source during an ON state of the second regulator transistor and a second voltage source different from the first voltage source during an OFF state of the second regulator transistor; and a switch switching a biasing input to the second regulator transistor between the first voltage source and the second voltage source.

According to a second aspect of the present teachings, an arrangement for reducing leakage current in regulator transistors for a power amplifier is provided, comprising: a first switching arrangement to switch a biasing input of a first regulator transistor between a first condition where the first regulator transistor is biased by an input voltage to the first regulator transistor during an ON state of the first regulator transistor and a second condition where the first regulator transistor is biased by a leakage current reduction voltage during an OFF state of the first regulator transistor, wherein, during the OFF state of the first regulator transistor, a sub-threshold biasing voltage of the first regulator transistor is controllably distanced from a threshold voltage Vth of the first regulator transistor by controlling the leakage current reduction voltage; a second switching arrangement to switch a biasing input of a second regulator transistor connected with the first regulator transistor between a first condition where the second regulator transistor is biased by a first voltage during an ON state of the second regulator transistor and a second voltage different from the first voltage during an OFF state of the second regulator transistor; and a switch switching a biasing input to the second regulator transistor between the first voltage and the second voltage.

According to a third aspect of the present teachings, a leakage current reduction circuit is provided, comprising: (a) a first regulator transistor comprising an input adapted to bias the regulator transistor in an ON condition, as soon as an activation voltage reaches a threshold value, or an OFF condition; (b) first switching means connected with the input of the first regulator transistor to connect the input of the first regulator transistor with a first voltage during the ON condition of the first regulator transistor and a second voltage during the OFF condition of the first regulator transistor, wherein, in the OFF condition, a voltage distance between the activation voltage and the threshold value is higher than an absolute value of the threshold value; (c) a second regulator transistor connected with the first regulator transistor, comprising an input; and (d) second switching means connected with the input of the second regulator transistor to connect the input of the second regulator transistor with a third voltage during an ON condition of the second regulator transistor and a fourth voltage during an OFF condition of the second regulator transistor.

Further embodiments are provided in the specification, drawings and claims of the present application.

BRIEF DESCRIPTION OF THE DRAWINGS

Like reference numbers and designations in the various drawings indicate like elements.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein.

Figure 3:
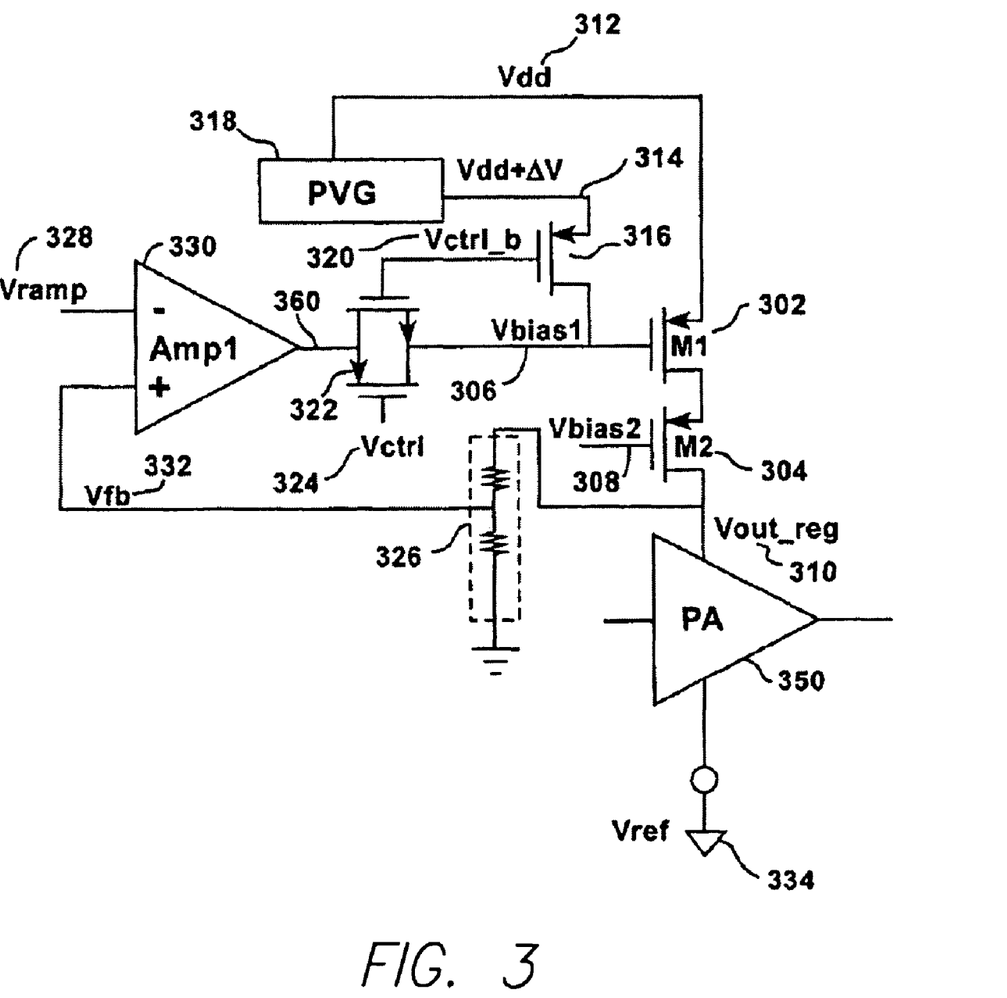
FIG. 3 shows an arrangement of a power amplifier having a voltage regulator in accordance with one embodiment of the present disclosure.

FIG. 3 shows a circuital arrangement according to an embodiment of the present disclosure. In particular, FIG. 3 shows a simplified block diagram of a power amplifier PA (350) with regulator transistors M1 (302) and M2 (304). In addition to the power amplifier and regulator transistor shown in FIG. 2, a positive voltage generator block PVG (318) and switching logic (316, 320, 322, 324) are included in the circuit of FIG. 3 as shown.

According to the embodiment of FIG. 3, a gate input voltage (306) of a p-channel regulator transistor M1 (302) is provided either by PVG (318) or by the op amp (330). The choice of input to be provided to the regulator transistor M1 (302) is made by a transistor (316) and a pass gate (322). In particular, when the power amplifier PA (350) is biased in an OFF state, the pass gate (322) disconnects the gate input Vbias1 (306) from the output of the op amp (230) and the transistor (316) connects it to the output (314) of the PVG (318).

In the embodiment shown in FIG. 3, the PVG (318) provides a positive bias Vdd+ΔV that is higher than the power supply Vdd (312). By way of example, ΔV can be selected to be equal to the threshold voltage of M1, e.g., 0.4V. If the PVG output voltage (314) is 0.4V higher than the power supply (312), then the Vgs of the regulator transistor M1 (302) is +0.4V. Given that the regulator transistor M1 (302) comprises a p-channel transistor in the present embodiment, the Vgs values for biasing such transistor in the ON state comprise negative values. Therefore, a +0.4V Vgs value turns off M1 (302) by an additional 0.4V. While this does not affect the OFF status of M1 (302), it advantageously affects its leakage current. In particular, assuming that M1 (302) has a sub-threshold swing S=100 mV/decade, the leakage current of M1 (302) is reduced by 4 orders of magnitude. Therefore, such reduction provides the transistor M1 (302) with an acceptable level of leakage during its OFF state. The person skilled in the art of electronics design, and particularly in the power amplifier design arts, will understand, upon review of the present teachings, that the amount of leakage current of M1 can be controlled via the selection of the value ΔV.

The operation of the switching logic (316, 320, 322, 324) is now described in more detail. In particular, two complementary logic control signals, Vctrl (324) and Vctrl_b (320) are provided in order to cause the pass gate (322) to switch. In the embodiment of FIG. 3, the pass or transmission gate (322) comprises a combination of an n-channel MOS transistor (upper transistor in FIG. 3) and a p-channel MOS transistor (lower transistor in FIG. 3). The control voltages Vctrl (324) and Vctrl_b (320) are provided by circuitry not shown in this figure using means well known to those skilled in the circuit design arts. Vctrl (324) is typically allowed to vary in value from supply voltage Vdd (312) to a value near Vdd/2. Vctrl_b (320) varies in a complementary or opposite manner to Vctrl (324).

Therefore, when Vctrl (324) is in digital "high" state (for example, when it is equal to Vdd (312)), Vctrl_b (320) is lower and close to Vdd/2 in this particular implementation. In contrast, when Vctrl (324) is in a digital "low" state (for example, close to Vdd/2), then Vctrl_b (320) is high.

When it is desired to operate the power amplifier (350) in the OFF state, the digital control voltage Vctrl (324) is provided to the gate of the p-channel transistor of the pass gate (322) in the high state. When Vctrl (324) is in the high state, it turns off the p-channel transistor of the pass gate (322). At the same time, Vctrl_b (320), which is low, turns off the n-channel transistor of the pass gate (322) and turns on the p-channel transistor (316). In this state, the pass gate (322) disconnects the gate input Vbias1 (306) from the output of the op amp (330), and Vbias1 (306) is coupled to the output (314) of the PVG (318) through the transistor (316). As described above, this condition turns off the regulator transistor M1 (302), thereby disconnecting the power supply Vdd (312) from the power amplifier (350).

When the power amplifier (350) is desired to operate in the ON state, the digital control voltage Vctrl (324) is provided to the gate of the p-channel transistor of the pass gate (322) in the low state. When Vctrl (324) is in the low state, it turns on the p-channel transistor of the pass gate (322). At the same time, Vctrl_b (320), which is high, turns on the n-channel transistor of the pass gate (322) and turns off the p-channel transistor (316). In this state, the pass gate (322) connects the gate input Vbias1 (306) to the output of the op amp (330), and Vbias1 (306) is disconnected from the output (314) of the PVG (318). The output of the op amp (330) is indicative of the difference between a signal Vfb (332) and a signal Vramp (328). The signal Vfb (332) is indicative of the regulated voltage Vout_reg (310) as shown by the feedback path connecting Vout_reg (310) to Vfb (332) through voltage divider (326).

Therefore, Vfb (332) is a scaled version of Vout_reg (310) set by sizing the resistors in the voltage divider (326). The op amp (330) compares Vramp (328) to Vfb (332) and drives Vbias1 (306) such that regulator transistor M1 (302) drops a voltage level below Vdd (312) to properly set Vout_reg (310). The maximum output power level occurs when Vout_reg approaches Vdd. A typical range for the Vramp (328) control signal is 0.1-1.75V and the typical battery voltage Vdd is 3.5V. Therefore, the regulator loop can be designed such that the ratio between Vout_reg and Vramp is 3.5/1.75 or 2, set by the resistive divider (326).

Due to reliability constraints, semiconductor processes typically have a specified maximum voltage that is allowed to exist from a source to drain across a transistor ("Max Vds"). When the difference in potential between power supply (e.g., battery supply) Vdd (312) and Vref (334) is less than the Max Vds of the regulator transistor (302), a single transistor M1 (302) is sufficient to prevent violation of the Max Vds rule in the regulator block.

Therefore, in one embodiment, the regulator transistor M2 (304) is replaced with a direct electrical connection disposed between the drain of the regulator transistor M1 (302) and Vout_reg (310). In such an embodiment, when the regulator transistor M1 (302) is biased in the OFF condition, the entire potential Vdd-Vref is applied as the Vds across that transistor.

In another embodiment, when the difference in potential between the power supply Vdd (312) and Vref (334) exceeds Max Vds of the transistor M1 (302), the regulator transistor M2 (304) can be coupled as shown in FIG. 3 between the drain of the regulator transistor M1 (302) and the Vout_reg (310). The gate input Vbias2 (308) of the regulator transistor M2 (304) is, in one embodiment, equal to half of the power supply Vdd. When Vbias2 (308) equals half of the power supply Vdd and the regulator transistor M1 (302) is biased in the OFF condition, the power supply voltage Vdd is shared equally across the regulator transistors M1 (302) and M2 (304), thereby doubling the maximum power supply that the regulator transistors can reliably handle. As one of ordinary skill in the art of electronic circuit design will appreciate, additional regulator transistors can be coupled in series to further increase the voltage handling capability of the regulator. A further embodiment of the present disclosure, wherein a switch may be used to select between two different Vbias2 voltages, is described below with reference to FIG. 7.

While the embodiment of FIG. 3 shows the regulator transistors as comprising p-channel MOS transistors, persons skilled in the electronics design arts will appreciate that the concepts set forth in the present disclosure are applicable to circuits having regulator transistors comprising other electronic devices, e.g., comprising n-channel MOS transistors. Such additional embodiment is described below with reference to FIG. 5 and FIG. 6. For example, as described below with reference to the embodiment shown in FIG. 5, the output (514) of a negative voltage generator NVG (518) is Vref−ΔV, thus further biasing M2 in the OFF condition, given that in this example its Vgs is equal to −ΔV.

Figure 4:
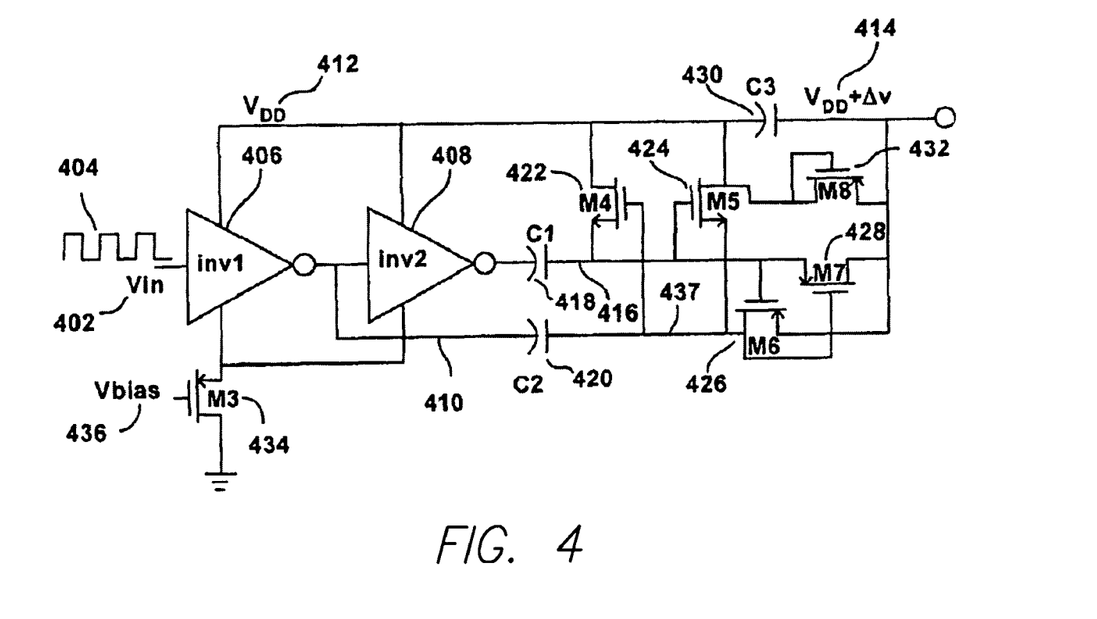
FIG. 4 shows an embodiment of the positive voltage generator (PVG) described with reference to the embodiment of FIG. 3.

FIG. 4 shows one embodiment of the positive voltage generator (PVG) described above with reference to FIG. 3. As shown in FIG. 4, the input Vin (402) of the PVG is driven by a low power square waveform (404) generator. Inverters Inv1 (406) and Inv2 (408) generate complementary waveforms along respective circuit paths (410), (416). The voltage across inverters Inv1 (406) and Inv2 (408) may be limited by p-channel MOS transistor M3 (434) and its gate input signal Vbias3 (436), in order to avoid violating the "Max Vds" limit on Inv1 (406) and Inv2 (408). A further current adjustment of the PVG can be obtained by adjusting the frequency of the input waveform (404).

Each waveform is coupled, along the paths (416) and (410), through respective capacitors C1 (418) and C2 (420), to a rectifying arrangement including switching transistors M4 through M7 (422, 424, 426 and 428). In accordance with the embodiment shown in FIG. 4, the gates of the switching transistors are driven by the coupled waveforms themselves in order to perform the switching action, and are therefore driven without need for a separate gate drive for the switches. In particular, according to the embodiment shown in FIG. 4, the switch M4 comprises an n-channel MOS transistor that couples the signal Vdd (412) to path (416) when the signal on path (410) is a logic "high". The switch M5 comprises an n-channel MOS transistor that couples the signal Vdd (412) to the path (437) when the signal on path (416) is a logic "high". The switch M6 comprises a p-channel MOS transistor that allows the signal on the path (437) to be transmitted to the output when the signal on the path (416) is a logic "low". The switch M7 comprises a p-channel MOS transistor that allows the signal on the path (416) to be transmitted to the output when the signal on path (410) is a logic "low".

As shown in the embodiment of FIG. 4, the rectified voltage output (414) (see the voltage output (314) described above and shown in FIG. 3) is stored and filtered by capacitor C3 (430). A diode connected transistor M8 (432) acts as a voltage limiter that limits the output of the PVG to the supply (e.g., battery) voltage Vdd+one Vds=Vgs=ΔV that is approximately equal to the threshold voltage of device M8 (432). The value ΔV is controllable. For example, different values of ΔV may be obtained by varying the devices used to implement the transistor M8 (432).

The combined switching and driving arrangement shown in FIG. 4 results in a single supply voltage Vdd across any of the devices. This feature facilitates the use of single devices (i.e., there is no need of stacked—connected in series—devices to handle a higher Vds voltage) in the charge pump circuit of FIG. 4, thus increasing efficiency and decreasing current consumption. For example, if two devices in series had to be used for each switch in the charge pump to handle the excessive Vds voltage, the gate capacitance of the switches would increase due to larger devices needed for the same switch resistance (as obtained when using only one device). Larger gate capacitance would result in larger driving current, thus decreasing the efficiency of the charge pump.

According to a practically implemented embodiment of the charge pump, the charge pump had a current consumption of 0.25 µA operating at several hundred Kilohertz.

Figure 5:
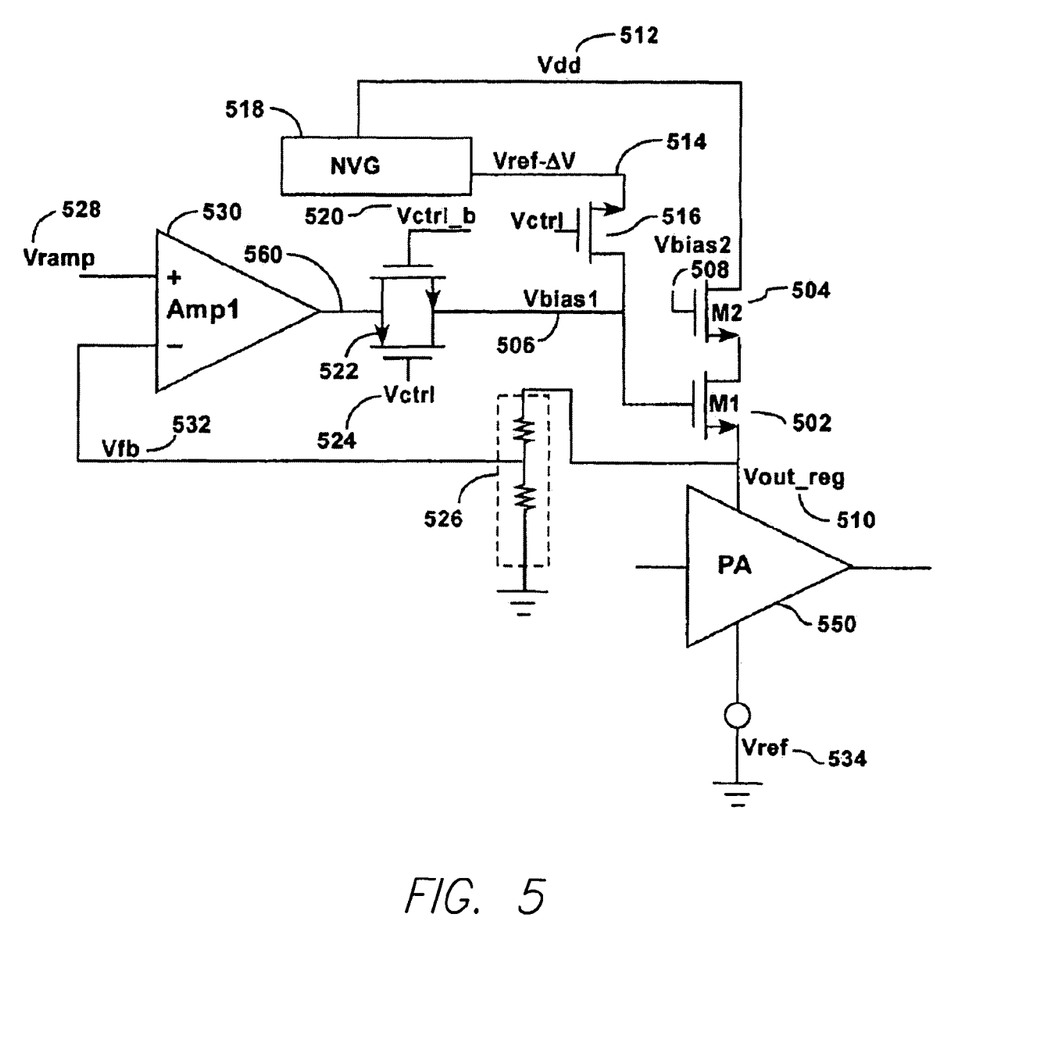
FIG. 5 shows a further arrangement of a power amplifier having a voltage regulator according to a further embodiment of the present disclosure.

As noted hereinabove, the embodiment of FIG. 5 shows a negative voltage generator NVG (518) and n-channel MOS transistors M1 (502) and M2 (504). The operation of the embodiment of FIG. 5 is described briefly below. The person skilled in the art will understand that the structure and the operation can be also understood from the description of the PVG and p-channel MOS embodiment described above with reference to FIG. 3. As shown in FIG. 5, NVG (518) generates a voltage (514) equal to Vref−ΔV that is lower than the reference voltage Vref. By way of example, ΔV can be selected to equal to the threshold voltage of M1B, e.g., 0.4V.

Similarly to what is described above with reference to the embodiment of FIG. 3, a switching arrangement A of FIG. 5 disconnects the steering op amp (530) during a power down condition and switching arrangement B of FIG. 5 connects the NVG voltage (514) to the gate of the pass device M1 (502) of the regulator of FIG. 5. Also in the embodiment shown in FIG. 5, similarly to what is shown in the embodiment of FIG. 3, Vbias2 (508) can be adjusted to provide equal voltage division between devices M1 (502) and M2 (504). Should Vout_reg (510) be adjusted to close to Vdd, the voltage output of op amp (530) should be above Vdd.

Figure 6:
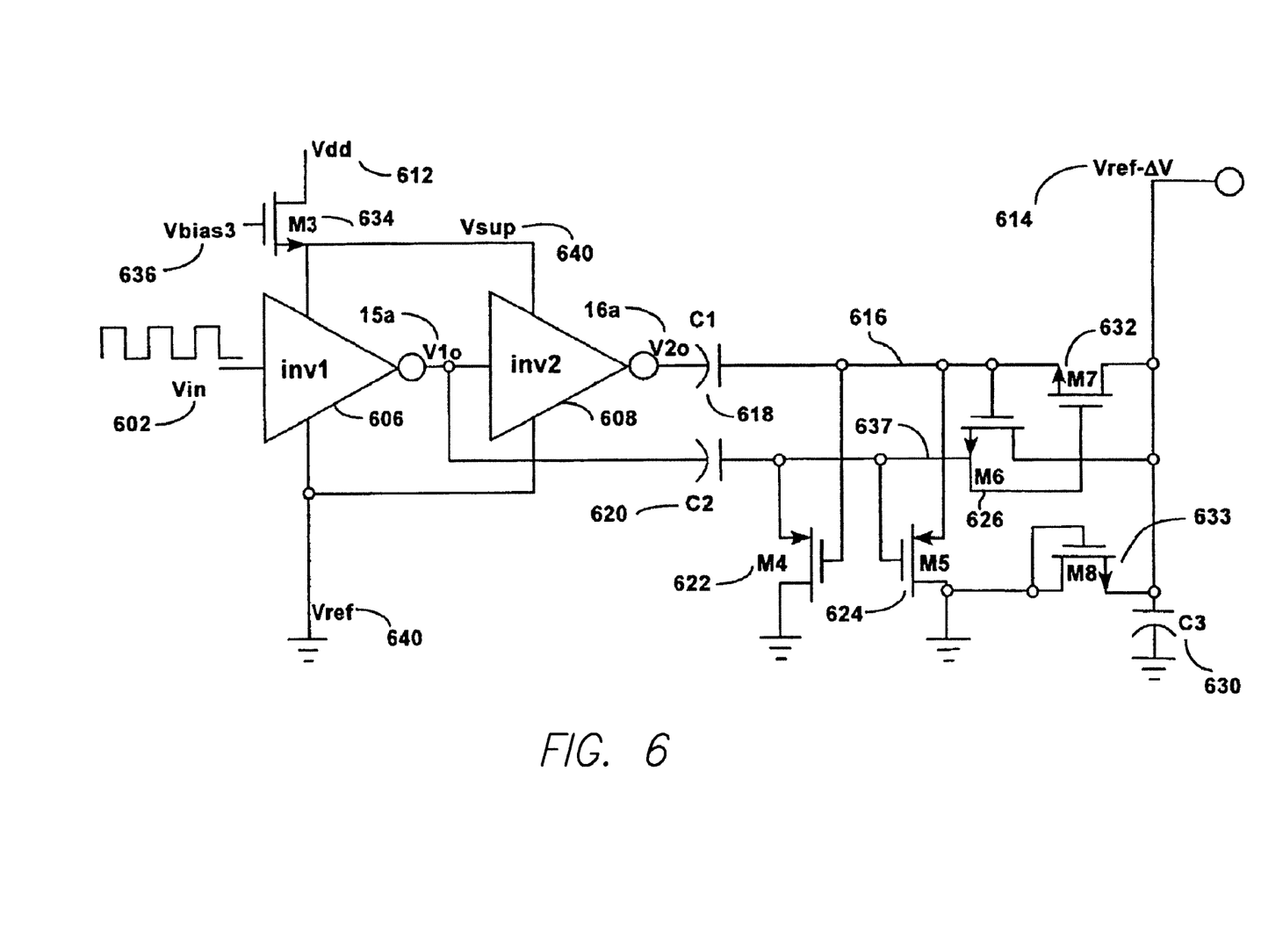
FIG. 6 shows one embodiment of the negative voltage generator (NVG) described with reference to FIG. 5.

Similarly to what is shown and described with reference to the embodiment of FIG. 4, FIG. 6 shows one embodiment of the negative voltage generator (NVG) described above with reference to FIG. 5. Also in this case, the person skilled in the art will understand that the structure and operation of the NVG of FIG. 6 can be understood from the description of the PVG provided in FIG. 4.

Inverters Inv1 (606), Inv2 (608), capacitors C1 (618), C2 (620), and transistors M4 (622) and M5 (624) act as level shifters that output complementary square waveforms at nodes (616) and (637) of value Vref to Vref−Vsup. This waveform is rectified by switches M7 (632) and M6 (626) that are self driven from the same waveforms but opposite phases. Transistor M8 (633) acts as a negative voltage limiter and capacitor C3 (630) performs a storage and filtering function. Transistor M3 (634) together with its gate input Vbias3 (636) limits the Vsup voltage in order to avoid violating the "max Vds" limit on Inv1 (606) and Inv2 (608).

Figure 7:
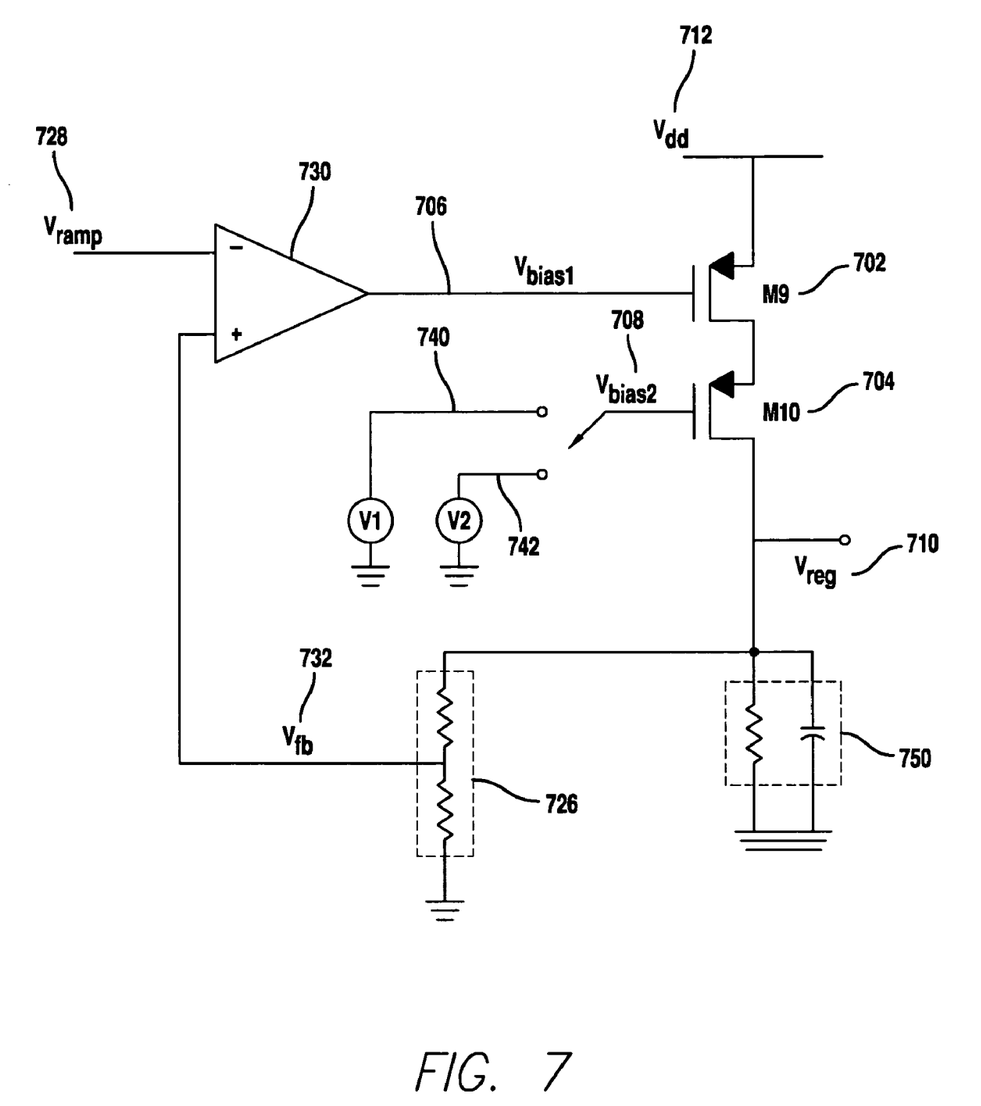
FIG. 7 shows a further embodiment of the present disclosure wherein a switch is used to select between two different biasing voltages.

Reference is now made to FIG. 7, which shows an embodiment of the present disclosure where a switch is used to select between two bias voltages. The embodiment of FIG. 7 is independent of the presence/absence of a positive voltage generator such as PVG (318) of FIG. 3 or a negative voltage generator such as NVG (518) of FIG. 5.

In particular, FIG. 7 shows a circuital arrangement with regulator transistors M9 (702) and M10 (704). According to the embodiment of FIG. 7, a gate input voltage Vbias1 (706) of p-channel regulator transistor M9 (702) is provided by an op amp (730). The output of the op amp (730) is indicative of the difference between a signal Vfb (732) and a signal Vramp (728). The signal Vfb (732) is indicative of the regulated voltage Vreg (710) as shown by the feedback path connecting Vreg (710) to Vfb (732) through voltage divider (726). Therefore, similarly to what shown in FIG. 3 and FIG. 5, Vfb (732) is a scaled version of Vreg (710) set by sizing the resistors in the voltage divider (726). The op amp (730) compares Vramp (728) to Vfb (732) and drives Vbias1 (706) such that regulator transistor M9 (702) drops a voltage level below Vdd (712) to properly set Vreg (710). The maximum output power level occurs when Vreg approaches Vdd. A typical range for the Vramp (728) control signal can be 0.1-1.75V and the typical voltage Vdd (e.g., a battery voltage) is 3.5V. Therefore, the regulator loop can be designed such that the ratio between Vreg (710) and Vramp is 3.5/1.75 or 2, set by the resistive divider (726). The circuital arrangement of FIG. 7 is coupled to a load circuit (750).

The presence of the additional regulator transistor M10 (704) is useful in embodiments where the difference in potential between the power supply Vdd (712) and Vref or ground exceeds the Max Vds of the transistor M9 (702). As shown in FIG. 7, the regulator transistor M10 (704) is coupled between the drain of the regulator transistor M9 (702) and Vreg (710). As is shown further in FIG. 7, the gate input Vbias2 (708) of the regulator transistor M10 (704) can be switched between two different voltage values V1 (740) and V2 (742), according to the ON or OFF condition of M10 (704). For example, assuming V2>V1, Vbias2 will connect to V2 (742) when M10 (704) is OFF to reduce its Vgs and hence its leakage current. On the other hand, Vbias2 will connect to V1 (740) when M10 (704) is ON to increase its Vgs and hence reduce its "on" resistance.

With continued reference to the diagram of FIG. 7, as Vbias2 decreases, the Vds of M9 increases and the Vds of M10 decreases. As Vbias2 increases, the Vds of M9 decreases and the Vds of M10 increases. Therefore, V1 has a lower limit of Vdd−maxVds$_{M9}$−Vgs$_{M10}$. On the other hand, V2 has an upper limit of maxVds$_{M10}$−Vgs$_{M10}$. According to an embodiment of the disclosure, V1 and V2 can be generated using resistive dividers off of Vdd.

Figure 8:
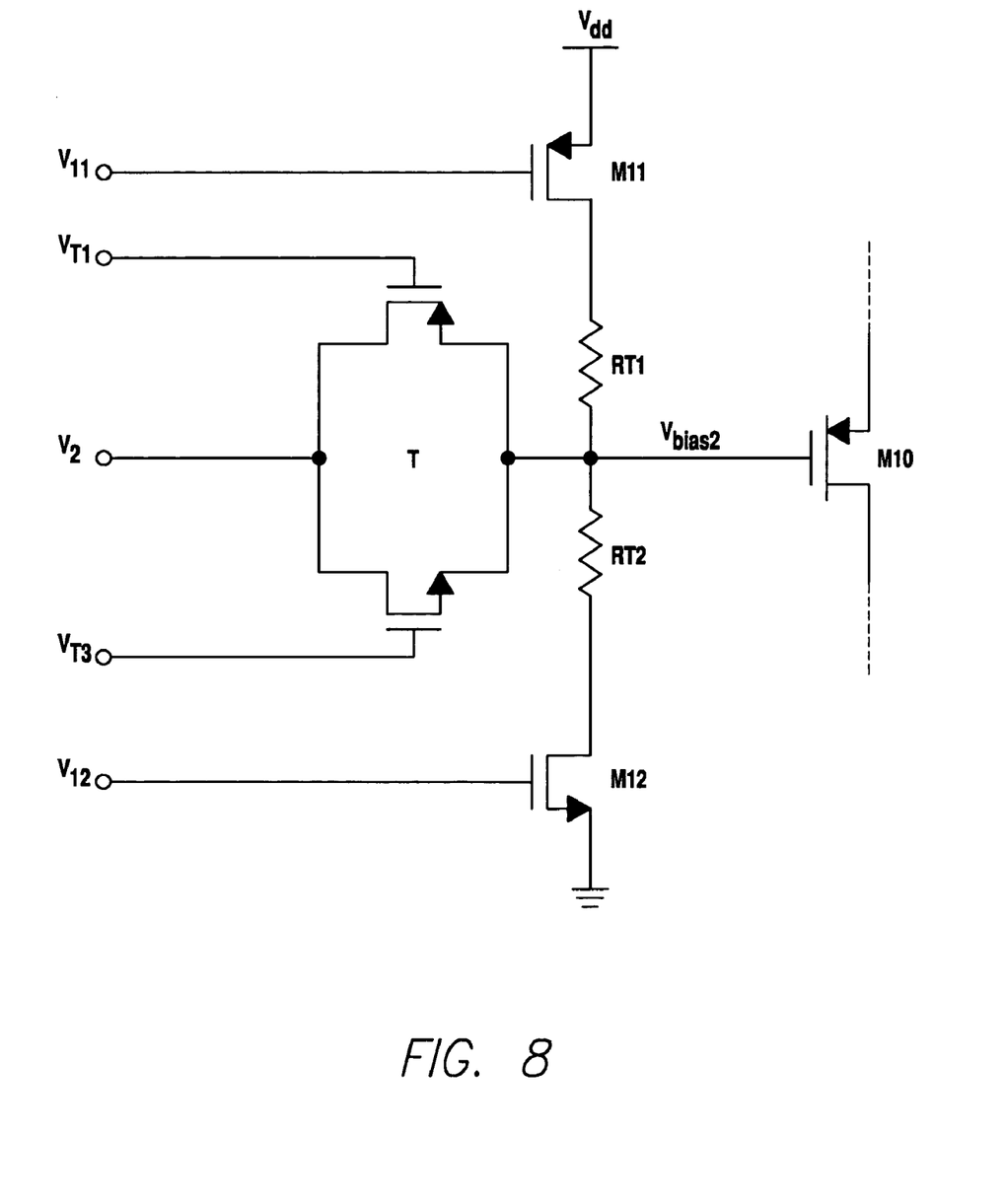
FIG. 8 shows one embodiment of the switch of FIG. 7.

FIG. 8 shows an embodiment of the switch between V1 and V2 shown in FIG. 7. In particular, the embodiment of FIG. 8 shows a transmission gate T and a resistive divider comprised of resistors RT1 and RT2. When the signals VT1 and VT3 bias the transmission gate T in an ON condition, M11 and M12 are in an OFF condition, and Vbias2=V2. When, on the other hand, VT1 and VT3 bias T in an OFF condition, M11 and M12 are ON and Vbias2 equals to V1, where V1 is selected in accordance with the values of RT1 and RT2. The biasing voltages V11, V12, V2, VT1 and VT3 can be selected according to techniques known to the person skilled in the art and is not described further herein in detail. By way of example, such biasing voltages can be generated by a resistive divider.

According to a further embodiment of the disclosure, the embodiment of FIG. 7 can be combined with the embodiment of FIG. 3 or the embodiment of FIG. 5. In the first case, the gate terminal Vbias2 (308) of M2 (304) of FIG. 3 will be switchable between two different voltage values. In the second case, the gate terminal Vbias2 (508) of M2 (504) of FIG. 5 will be switchable between two different voltage values.

With continued reference to the embodiment shown in FIG. 7, one of ordinary skill in the art of electronic circuit design will appreciate that additional regulator transistors can be coupled in series to further increase the voltage handling capability of the regulator. The devices according to the present disclosure can also be used, by way of example, with power amplifiers present in amplitude modulators, such as those found in EDGE type GSM radios.

Accordingly, what is described herein are improved devices and methods for leakage current reduction. While the devices and methods have been described by means of specific embodiments and applications thereof, it is understood that numerous modifications and variations could be made thereto by those skilled in the art without departing from the spirit and scope of the disclosure. It is therefore to be understood that within the scope of the claims, the disclosure may be practiced otherwise than as specifically described herein.

A number of embodiments of the present inventive concept have been described. Nevertheless, it will be understood that various modifications may be made without departing from the scope of the inventive teachings. For example, also integrated CMOS regulators can be used with the inventive concepts taught in the present disclosure, both in the PVG and NVG embodiments and in the switching bias arrangement of FIG. 7.

Accordingly, it is to be understood that the inventive concept is not to be limited by the specific illustrated embodiments, but only by the scope of the appended claims. The description may provide examples of similar features as are recited in the claims, but it should not be assumed that such similar features are identical to those in the claims unless such identity is essential to comprehend the scope of the claim. In some instances the intended distinction between claim features and description features is underscored by using slightly different terminology.

What is claimed is:

1. An arrangement for reducing leakage current in a regulator transistor, comprising:
   a first regulator transistor biased by an input voltage;
   a second regulator transistor connected with the first regulator transistor and biased by a first voltage source during an ON state of the second regulator transistor and a second voltage source different from the first voltage source during an OFF state of the second regulator transistor; and
   a switch switching a biasing input to the second regulator transistor between the first voltage source and the second voltage source.

2. The arrangement of claim 1, wherein the first regulator transistor and the second regulator transistor are PMOS transistors and the second voltage source is higher than the first voltage source.

3. The arrangement of claim 1, wherein the first regulator transistor and the second regulator transistor are NMOS transistors and the first voltage source is higher than the second voltage source.

4. The arrangement of claim 1, wherein the first regulator transistor and the second regulator transistor are connected with a supply voltage and the first voltage source and the second voltage source depend on the supply voltage.

5. The arrangement of claim 4, wherein the first voltage source and the second voltage source are generated from the supply voltage through resistive dividers.

6. The arrangement of claim 1, wherein the first voltage source and the second voltage source are generated through a transmission gate and a resistive divider.

7. The arrangement of claim 6, wherein the transmission gate has an ON condition and an OFF condition, and wherein in the ON condition the biasing input to the second regulator transistor is provided by the first voltage source and in the OFF condition the biasing input to the second regulator transistor is provided by the second voltage source.

8. The arrangement of claim 1, wherein the first regulator transistor is cascode connected to the second regulator transistor.

9. The arrangement of claim 1, further comprising an operational amplifier having an output that generates the input voltage biasing the first regulator transistor.

10. The arrangement of claim 9, further comprising a regulated output feedback-connected to an input of the operational amplifier.

11. The arrangement of claim 10, wherein the regulated output is feedback-connected to the input of the operational amplifier through a resistive divider.

12. An arrangement for reducing leakage current in regulator transistors for a power amplifier, comprising:
   a first switching arrangement to switch a biasing input of a first regulator transistor between a first condition where the first regulator transistor is biased by an input voltage to the first regulator transistor during an ON state of the first regulator transistor and a second condition where the first regulator transistor is biased by a leakage current reduction voltage during an OFF state of the first regulator transistor, wherein, during the OFF state of the first regulator transistor, a sub-threshold biasing voltage of the first regulator transistor is controllably distanced from a threshold voltage Vth of the first regulator transistor by controlling the leakage current reduction voltage;
   a second switching arrangement to switch a biasing input of a second regulator transistor connected with the first regulator transistor between a first condition where the second regulator transistor is biased by a first voltage during an ON state of the second regulator transistor and a second voltage different from the first voltage during an OFF state of the second regulator transistor; and
   a switch switching a biasing input to the second regulator transistor between the first voltage and the second voltage.

13. The arrangement of claim 12, wherein the first regulator transistor and the second regulator transistor are connected with a supply voltage and the first voltage and the second voltage depend on the supply voltage.

14. The arrangement of claim 13, wherein the first voltage and the second voltage are generated from the supply voltage through resistive dividers.

15. The arrangement of claim 12, wherein the first voltage and the second voltage are generated through a transmission gate and a resistive divider.

16. The arrangement of claim 15, wherein the transmission gate has an ON condition and an OFF condition, and wherein in the ON condition the biasing input to the second regulator transistor is provided by the first voltage and in the OFF condition the biasing input to the second regulator transistor is provided by the second voltage.

17. The arrangement of claim 12, wherein the first regulator transistor is connected with a supply voltage and the leakage current reduction voltage differs from the supply voltage by a controllable voltage amount $\Delta V$, thus distancing the sub-threshold biasing voltage of the first regulator transistor from the threshold voltage Vth of the first regulator transistor by an amount Vth+$\Delta V$.

18. The arrangement of claim 17, wherein the leakage current reduction voltage is a positive voltage.

19. The arrangement of claim 12, wherein the first regulator transistor is connected with a supply voltage and the leakage current reduction voltage differs from a reference voltage by a controllable amount $\Delta V$, thus distancing the sub-threshold biasing voltage of the first regulator transistor from the threshold voltage Vth of the first regulator transistor by an amount Vth+$\Delta V$.

20. The arrangement of claim 19, wherein the leakage current reduction voltage is a negative voltage.

21. The arrangement of claim 12, wherein $\Delta V$=Vth, thus distancing the sub-threshold biasing voltage of the first regulator transistor from the threshold voltage Vth of the first regulator transistor by an amount 2 Vth.

22. The arrangement of claim 12, wherein the switching arrangement comprises a switching transistor selectively connecting the biasing input of the first regulator transistor with the input voltage or the leakage current reduction voltage.

23. The arrangement of claim 22, wherein the switching transistor is a pass gate transistor.

24. The arrangement of claim 22, wherein the switching transistor is controlled by two complementary signals so that the first condition is obtained through activation of a first signal of the two complementary signals and the second condition is obtained through activation of the second signal of the two complementary signals.

25. The arrangement of claim 22, further comprising a further switch connected with the leakage current reduction voltage and between the switching transistor and the biasing input of the first regulator transistor, the further switch being synchronous with the switching transistor, the further switch connecting the first regulator transistor with the leakage current reduction voltage during the second condition and disconnecting the first regulator transistor from the leakage current reduction voltage during the first condition.

26. The arrangement of claim 25, wherein the further switch is a further transistor switch.

27. The arrangement of claim 12, further comprising a positive voltage generator, the positive voltage generator connected with a supply voltage and outputting the leakage current reduction voltage.

28. The arrangement of claim 12, further comprising a negative voltage generator, the negative voltage generator connected with a supply voltage and outputting the leakage current reduction voltage.

29. The arrangement of claim 1, further comprising the first regulator transistor and the second regulator transistor.

30. A power amplifier comprising the arrangement of claim 27, the power amplifier being connected to the regulator transistor.

31. A power amplifier comprising the arrangement of claim 28, the power amplifier being connected to the regulator transistor.

32. A leakage current reduction circuit comprising:
(a) a first regulator transistor comprising an input adapted to bias the regulator transistor in an ON condition, as soon as an activation voltage reaches a threshold value, or an OFF condition;
(b) first switching means connected with the input of the first regulator transistor to connect the input of the first regulator transistor with a first voltage during the ON condition of the first regulator transistor and a second voltage during the OFF condition of the first regulator transistor, wherein, in the OFF condition, a voltage distance between the activation voltage and the threshold value is higher than an absolute value of the threshold value;
(c) a second regulator transistor connected with the first regulator transistor, comprising an input; and
(d) second switching means connected with the input of the second regulator transistor to connect the input of the second regulator transistor with a third voltage during an ON condition of the second regulator transistor and a fourth voltage during an OFF condition of the second regulator transistor.

33. The leakage current reduction circuit of claim 32, wherein the voltage distance is equal to two times the absolute value of the threshold value.

34. The leakage current reduction circuit of claim 32, wherein the voltage distance is controllable by controlling the second voltage.

35. The leakage current reduction circuit of claim 32, wherein the first regulator transistor is connected with a power supply voltage and the second voltage is equal to the power supply voltage plus a controllable voltage value.

36. The leakage current reduction circuit of claim 35, wherein the second voltage is a positive voltage.

37. The leakage current reduction circuit of claim 32, wherein the second voltage is equal to a reference voltage minus a controllable voltage value.

38. The leakage current reduction circuit of claim 37, wherein the second voltage is a negative voltage.

* * * * *